(12) United States Patent
Hassan et al.

(10) Patent No.: US 9,296,651 B2
(45) Date of Patent: *Mar. 29, 2016

(54) HEAT STABLE SNAL AND SNMG BASED DIELECTRICS

(71) Applicants: Intermolecular Inc., San Jose, CA (US); Guardian Industries Corp. (Auburn Hills, MI, US), Auburn Hills, MI (US)

(72) Inventors: Mohd Fadzli Anwar Hassan, San Francisco, CA (US); Richard Blacker, Lino Lakes, MN (US); Guowen Ding, San Jose, CA (US); Muhammad Imran, Brownstown, MI (US); Jingyu Lao, Saline, MI (US); Minh Huu Le, San Jose, CA (US); Yiwei Lu, Ann Harbor, MI (US); Zhi-Wen Wen Sun, Sunnyvale, CA (US)

(73) Assignees: Intermolecular, Inc., San Jose, CA (US); Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/299,341

(22) Filed: Jun. 9, 2014

(65) Prior Publication Data

US 2014/0287254 A1    Sep. 25, 2014

Related U.S. Application Data

(63) Continuation of application No. 13/305,550, filed on Nov. 28, 2011, now Pat. No. 8,784,934.

(51) Int. Cl.
| | |
|---|---|
| *B32B 17/06* | (2006.01) |
| *B32B 15/04* | (2006.01) |
| *C03C 17/36* | (2006.01) |
| *H01B 3/10* | (2006.01) |
| *C03C 17/245* | (2006.01) |
| *C23C 28/00* | (2006.01) |
| *C23C 14/08* | (2006.01) |

(52) U.S. Cl.
CPC ........... *C03C 17/366* (2013.01); *C03C 17/2453* (2013.01); *C03C 17/36* (2013.01); *C03C 17/3618* (2013.01); *C03C 17/3642* (2013.01); *C23C 14/08* (2013.01); *C23C 28/32* (2013.01); *C23C 28/345* (2013.01); *H01B 3/10* (2013.01)

(58) Field of Classification Search
USPC ......... 428/426, 432, 433, 434, 688, 689, 699, 428/701, 702
See application file for complete search history.

(56) References Cited

U.S. PATENT DOCUMENTS

| | | | | |
|---|---|---|---|---|
| 5,591,529 | A * | 1/1997 | Braatz et al. | 428/457 |
| 2004/0219343 | A1 * | 11/2004 | DePauw | 428/212 |
| 2006/0139783 | A1 * | 6/2006 | Decroupet | 359/883 |

\* cited by examiner

*Primary Examiner* — Lauren R Colgan

(57) ABSTRACT

A transparent dielectric composition comprising tin, oxygen and one of aluminum or magnesium with preferably higher than 15% by weight of aluminum or magnesium offers improved thermal stability over tin oxide with respect to appearance and optical properties under high temperature processes. For example, upon a heat treatment at temperatures higher than 500 C, changes in color and index of refraction of the present transparent dielectric composition are noticeably less than those of tin oxide films of comparable thickness. The transparent dielectric composition can be used in high transmittance, low emissivity coated panels, providing thermal stability so that there are no significant changes in the coating optical and structural properties, such as visible transmission, IR reflectance, microscopic morphological properties, color appearance, and haze characteristics, of the as-coated and heated treated products.

17 Claims, 4 Drawing Sheets

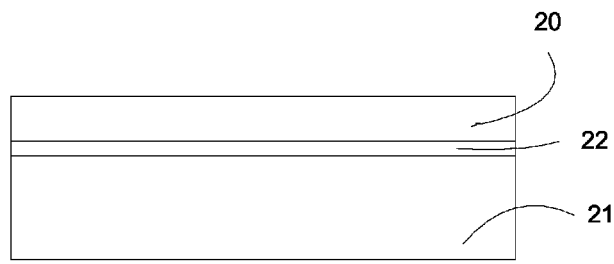
Fig. 4A
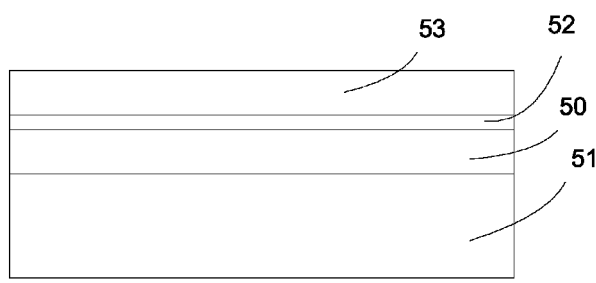
Fig. 4B
| 58 |
|----|
| 57 |
| 56 |
| 52 |
| 55 |
| 50 |
| 54 |
| 51 |
Fig. 4C

HEAT STABLE SNAL AND SNMG BASED DIELECTRICS

CROSS-REFERENCE TO RELATED APPLICATIONS

This is a Continuation Application of U.S. patent application Ser. No. 13/305,550, now issued as U.S. Pat. No. 8,784,934, filed Nov. 28, 2011, which is herein incorporated by reference for all purposes.

FIELD OF THE INVENTION

The present invention relates generally to films providing high transmittance and low emissivity, and more particularly to such films deposited on transparent substrates.

BACKGROUND OF THE INVENTION

Sunlight control glasses are commonly used in applications such as building glass windows and vehicle windows, typically offering high visible transmission and low emissivity. High visible transmission can allow more sunlight to pass through the glass windows, thus being desirable in many window applications. Low emissivity can block infrared (IR) radiation to reduce undesirable interior heating.

In low emissivity glasses, IR radiation is mostly reflected with minimum absorption and emission, thus reducing the heat transferring to and from the low emissivity surface. Typical sunlight control glasses have generally an emissivity of about 0.1 and a light transmission of about 80%. High transmittance, low emissivity glasses generally include a reflective metal film to provide infrared reflectance and low emissivity, which is sandwiched between antireflective films to reduce the visible reflectance.

In certain cases, the glasses are heat treated for tempering, bending or strengthening, requiring the use of temperatures of 500 C or higher. The heat treatment process can affect the coatings, such as deterioration, structural or color changes, or become hazy following the heat treatment, exhibiting a reduction in visible transmission and significant color changes.

SUMMARY

In some embodiments, the present invention discloses a transparent dielectric composition comprising tin, oxygen and one of aluminum or magnesium with higher than 2.5% by weight, and preferably higher than 15% by weight of the total metal weight. The present transparent dielectric composition can offer improved thermal stability over tin oxide and other dielectric materials with respect to appearance and optical properties under high temperature processes, including reflective and transmittive optical properties. For example, upon a heat treatment at a temperature higher than 500 C, changes in color and index of refraction of the present transparent dielectric composition are noticeably less than those of tin oxide films of comparable thickness. Further, the present composition can offer minimum structural changes, including possessing an amorphous structure that is stable upon the high temperature process. In some embodiments, the present transparent dielectric composition comprises less than 70% by weight of aluminum or magnesium with respect to the total metal weight in the composite film; and preferably comprises less than 35% by weight.

In some embodiments, the present invention discloses a method and a high transmittance, low emissivity coated panel fabricated from the method, wherein the panel comprises a transparent substrate coated with a transparent dielectric film comprising tin, oxygen and one of aluminum or magnesium present in amounts higher than 2.5% by weight and preferably higher than 15% by weight. The coated panel can be used as low emissivity transparent substrates, offering improved thermal stability, for example, as compared with tin oxide coatings with regard to structural and optical property changes upon high temperature processes. The transparent dielectric film can be coated on glass or plastic substrates, offering low emissivity properties together with minimal variations after high temperature processes.

In some embodiments, the high transmittance, low emissivity coated panel further comprises other layers, such as a metallic reflective film, an antireflection layer, and a coating protection layer, together with a sequence of repeated multilayers.

In some embodiments, the present invention discloses a transparent dielectric layer serving as a thickness optical filler, which comprises tin, oxygen and one of aluminum or magnesium. To improve the transmittance, the thicknesses of the coated layers are normally preferred to be as thin as possible. However, in certain cases, a fixed thickness is desirable, for example, to achieve destructive interferences in the beams reflected from the interfaces, and constructive interference in the corresponding transmitted beams. Since the present transparent dielectric layer possesses improved color and optical properties with respect to high temperature process, it can serve as a thickness optical filler for coated panels, preserving its properties after the high temperature process.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 4A-4C illustrate exemplary coating layers on transparent panels.

DETAILED DESCRIPTION

Figure 1:
FIG. 1 illustrates an exemplary thin film according to an embodiment of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The invention relates to materials for transparent and low emissive coatings and to coated transparent panels, such as glass panels, with improved thermal stability. The coated transparent panels can comprise a transparent substrate having one or more transparent low emissive coatings. Such panels offer high transmission of visible light with high thermal reflectance, and generally comprise an infrared (IR) reflecting layer embedded between transparent antireflection layers.

The coated glass panels sometimes are desired to be heat treated, e.g., to toughen the glass substrate or to ease bending in various areas of applications. The substrates are typically heated to a temperature near or above the softening point and then toughened by rapid cooling or bending them to appropriate shapes. For example, tempered glass can be stronger than annealed glass, and can shatter into small pieces when broken. The temperature range for glass heat treatment is typically between 500 and 900 C, with a processing time of several minutes, e.g., between 5 to 10 minutes.

In some embodiments, the present invention provides a heat treatable dielectric low emissive coating, and corresponding coating stacks, which are thermally stable with minimal changes before and after a heat treatment, so that non-heat treated and heat treated substrates can be stocked interchangeably. Preferably, the heat treatment does not cause a significant change in the coating optical and structural properties, including reflective and transmittive optical properties, such as visible transmission, IR reflectance, microscopic morphological properties, color appearance, and haze characteristics. For example, the present coated transparent panels have reduced changes in appearance upon a heat treatment, such as a color difference that can be detected by visual inspection.

The coated transparent panels can comprise a glass substrate or any other transparent substrates, such as substrates made of organic polymers. The coated transparent panels can be used in window applications such as vehicle and building windows, skylights, or glass doors, either in monolithic glazings or multiple glazings with or without a plastic interlayer or a gas-filled sealed interspace.

Heat treatments of coated glass panels can generate some complications, such as changes in structural properties and color between non-heat treated and heat treated products, for example, upon heating of the coated glass, a color change can be observed, making the as-coated product and heat treated (tempered) product different in appearance.

In some embodiments, the present invention discloses materials, thin films, and processes that provide the coated panels with similar or same structures and appearance for as-coated and tempered products. In some embodiments, the present invention discloses coated panels where each of the individual layers in the coated stack is thermally stable and the interaction between layers is minimized during heating. The present coatings can be subjected to prolonged high temperature heat treatments without damaging the coated panels, with minimal property changes, such as light transmittance, IR reflection, structure and color appearance. In addition, the present coatings can protect the IR reflecting layers during the high temperature process, such as preventing oxidation or agglomeration of the IR reflective layer.

In some embodiments, the present invention discloses a transparent dielectric composition comprising tin, oxygen and one of aluminum or magnesium, which can offer improved thermal stability such as color appearance (e.g., reflective optical property) or transmittive optical properties (e.g., transparency) under high temperature processing. The high temperature processing can comprise an annealing at temperature higher than 500 C. For example, upon a heat treatment in a prolonged high temperature process, minimal changes in color and index of refraction of the present transparent dielectric composition are observed, wherein the changes are noticeably less than other transparent films, such as tin oxide films of comparable thickness. Further, the present composition can offer thin films having an amorphous structure, which is stable upon the high temperature process, and thus providing similar structural properties for heat treated and non heat treated products. Also, the amorphous structure can offer ease of glass processing, such as bending or shaping.

In some embodiments, the compound material has a composition of magnesium or aluminum of 2.5% or greater, preferably between 2.5% and 5%, and more preferably 15% or greater by weight of the total metal weight. The magnesium or aluminum composition is further preferably less than 70% by weight, and more preferably less than 35% by weight. In the present description, the weight percentage is defined as the weight percentage of the added element from the total metal weight. For example, in a tin magnesium compound, the weight percent of magnesium Mg % is expressed as a ratio of the weight of magnesium $W_{Mg}$ over the total weight of magnesium $W_{Mg}$ and tin $W_{Sn}$:

$$\text{Mg \%} = 100 \times \frac{W_{Mg}}{W_{Mg} + W_{Sn}}$$

The weight of non metal elements, for example, oxygen in tin magnesium oxide compounds, is not considered in the weight percentage calculations. For example, 15% by weight of magnesium in a tin magnesium oxide compound material is defined as the weight of magnesium being 15% of the total weight of tin and magnesium.

The present coating can be useful in different thickness ranges. In some embodiments, the present coatings can be used as an optical filler, providing the necessary optical thickness for the whole coating stack. In certain cases, the total thickness of the coating stack is predetermined, for example, a half wavelength thickness for antireflection purpose. Further, the active layers, such as the IR reflective coating of silver, is preferably as thin as possible, in order to not affect the visible light transmission property. Thus, in some embodiments, the present compound material can be used as an optical filler, providing the necessary thickness for the coated panels to effectively anti-reflect the IR radiation, while satisfying other requirements such as structural and color stability upon high temperature processing. The thickness can be less than 100 nm, and preferably less than 8 nm.

In some embodiments, the compound material comprises a tin magnesium oxide (Sn—Mg-Oxide) or tin aluminum oxide (Sn—Al-Oxide) system, having a mixture of tin oxide with one of magnesium or aluminum. The mixture can be a tin oxide doped with magnesium or aluminum. The mixture can also be an oxide alloy of tin with magnesium or aluminum. Further, the mixture can have different forms on the microscopic level, and in the context of the invention, comprising atoms of tin, oxygen and magnesium or aluminum, regardless of how they are bound to each other on the microscopic level. In some embodiments, the mixture of tin oxide with either magnesium or aluminum is proven to be suitable for a transparent compound layer with thermal stability properties, in addition to having high light transmittance and low thermal energy transmittance.

In some embodiments, the present transparent low emissive coating is an essentially homogeneous layer, such as having an amorphous structure. Such amorphous structure is preferred, but not absolutely necessary, since amorphous structures tend to have smaller grain growth compared to crystalline structures, thus can offer more stable structure, e.g., minimal structural changes, upon high temperature processing. For example, the present doped tin oxide remains amorphous with minimum structural changes after a high temperature treatment, as compared to tin oxide, which is a commonly used dielectric layer in the low emissive stack, exhibiting high grain growth, together with changes in optical properties, such as refractive index n and extinction coefficient k after similar heat treatment. In some embodiments, the present invention discloses alloying tin with another metal, for example, by reactive sputtering, to stabilize the dielectric properties during the heat treatment. For example, the alloying metal can be aluminum or magnesium with 2.5% or higher, preferably 15% or higher, by weight of aluminum or magnesium with respect to the total weight of tin and aluminum or magnesium, respectively. Tin aluminum oxide and tin magnesium oxide with more than 15% aluminum or magnesium by weight shows improved overall properties after a heat treatment, compared to pure tin oxide, including a stable structure, as determined by x-ray diffraction (XRD) spectra before and after the heat treatment, and smaller changes in optical properties as compared to tin oxide.

In some embodiments, the present composition allows a single product, in terms of minimal or no color change between as-coated and tempered glasses, avoiding the need for different stack designs used to match the color between as-coated and heat treated products. The present composition can be used in thin film coatings for transparent substrates.

FIG. 1 illustrates an exemplary thin film coating according to some embodiments of the present invention. The present transparent dielectric thin film 22 is disposed on a transparent substrate 21 to form a coated transparent panel 20, which is thermal stable, in addition to other functional and appearance properties, such as high visible light transmission, and low IR emission. The thermal stability of the present panels provides similar structural, optical and visible appearance properties for as-coated and heat treated panels, allowing ease of window and door designs and stockage.

The compound layer 22 can be deposited using different processes and equipment, for example, physical vapor deposition (PVD) or chemical vapor deposition (CVD), with sputtering processes preferred. The targets can be sputtered under direct current (DC), pulsed DC, alternate current (AC), radio frequency (RF) or any other suitable conditions. In some embodiments, the present invention discloses a physical vapor deposition method for depositing the transparent dielectric film which comprises tin, oxygen and one of aluminum or magnesium. In some embodiments, the method comprises supplying a gas mixture into a processing chamber, and sputtering material from one or more targets disposed in the processing chamber, wherein the targets comprise tin and one of aluminum or magnesium. In some embodiments, the process further comprises reacting the sputtered material with the gas mixture comprising oxygen. The sputtering process can utilize different target configurations, such as one target having tin, oxygen, and one of aluminum or magnesium; one target having tin, and one of aluminum or magnesium, with oxygen introduced from the reactive gas mixture; and two targets with one target comprising tin and the other target comprising one of aluminum or magnesium, with oxygen introduced from the reactive gas mixture. Other target configurations can also be used, such as a tin oxide target together with a target comprising one of aluminum or magnesium. The sputtering process can further comprise other components such as magnets for confining the plasma, and utilize different process conditions such as DC, AC, RF, or pulse sputtering. In some embodiments, the compound material is an essentially homogeneous layer, formed by sputter deposition from targets comprising tin and (magnesium or aluminum) in an oxygen-containing sputtering ambient.

Figure 2:
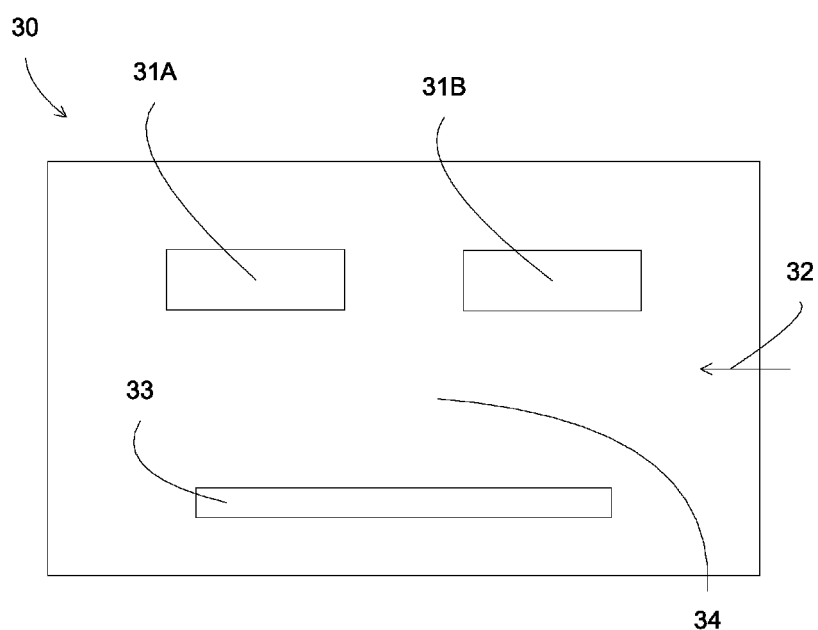
FIG. 2 illustrates an exemplary deposition configuration according to an embodiment of the present invention.

FIG. 2 illustrates an exemplary deposition configuration according to some embodiments of the present invention. A sputter deposition chamber 30 comprises two targets 31A and 32B disposed in a plasma environment 34, containing reactive species delivered from an outside source 32. The targets 31A and 31B can comprise tin and one of magnesium or aluminum, together with the reactive species of oxygen to deposit a mixture of tin, magnesium or aluminum, and oxygen to form a magnesium or aluminum doped tin oxide layer on substrate 33. This configuration is exemplary, and other sputter system configurations can be used, such as a single target comprising tin-magnesium or tin-aluminum alloy, or a ceramic target comprising tin-magnesium-oxide or tin-aluminum-oxide.

To assess the deposited compound layer properties, tests were performed using high temperature heat treatment of above 500 C for more than 5-10 minutes, to measure visual appearance and structure stability. The data were then compared with non-heat treated samples, showing that the color change after a heat treatment of the product is less than with tin oxide, and the structure of the deposited layer remained amorphous (from XRD spectra) after the heat treatment, allowing ease of glass processing, such as shaping and bending. Further, the stable structure and minimal color change allows for a single product for tempered and as-coated. The visible light transmittance property does not change after a heat treatment, and is similar to comparable state-of-the-art materials, such as tin oxide.

Figure 3A:
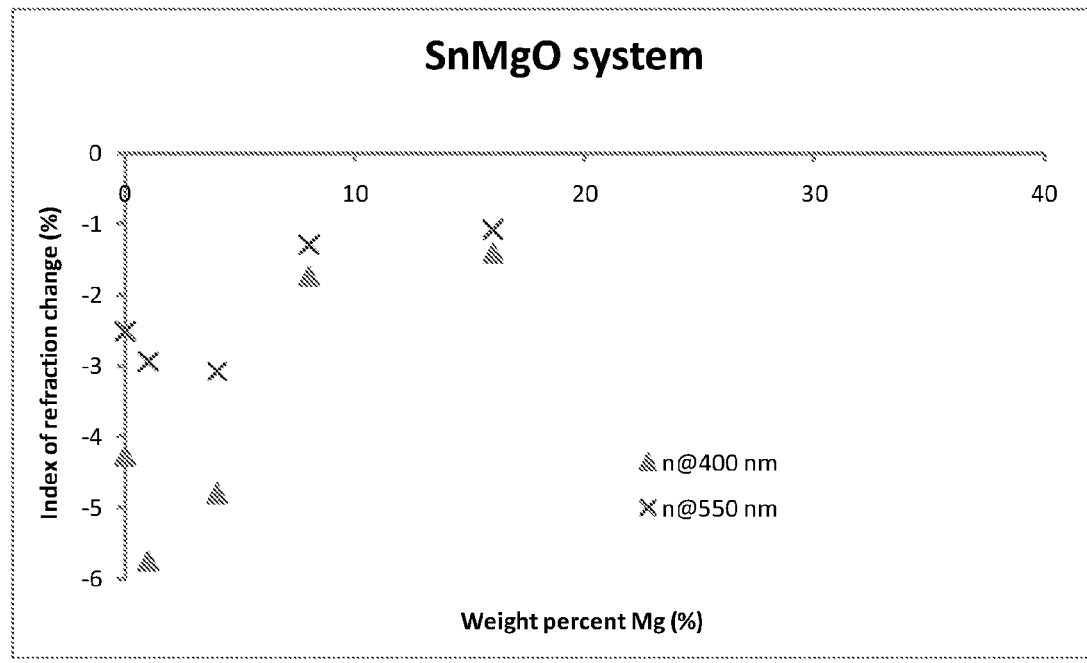
FIGS. 3A and 3B illustrate exemplary changes in index of refraction for Sn—Mg—O and Sn—Al—O systems.
Figure 3B:
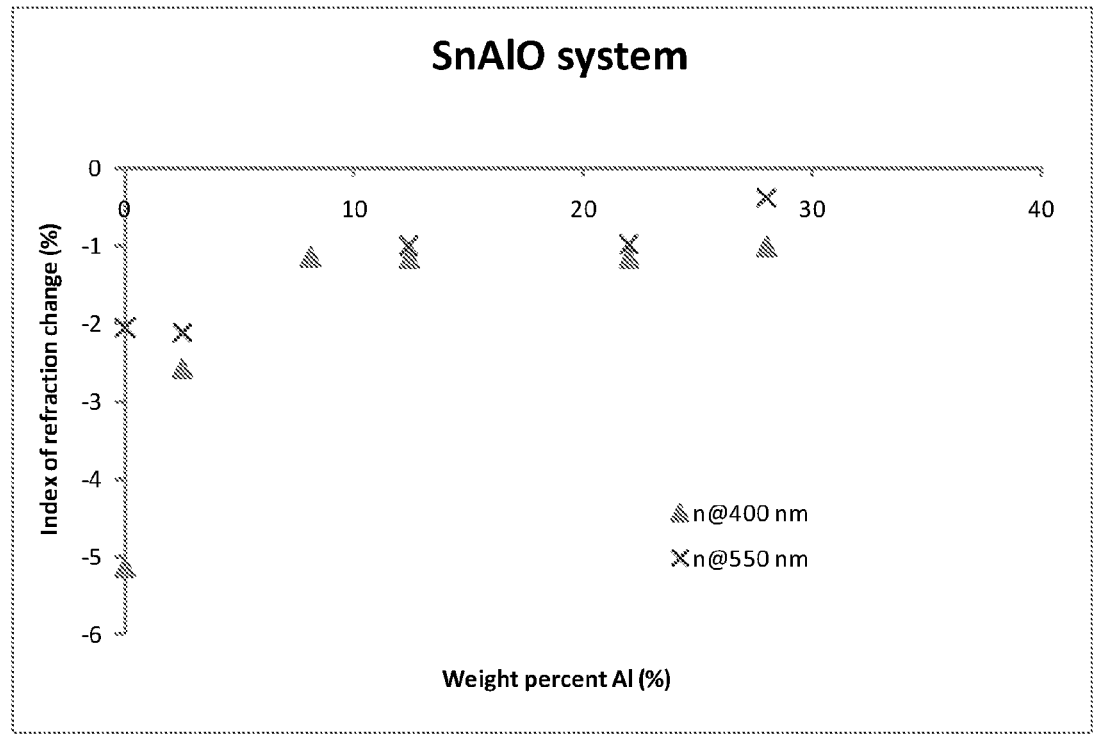

FIGS. 3A and 3B illustrate exemplary changes in index of refraction for Sn—Mg-Oxide and Sn—Al-Oxide systems according to some embodiments of the present invention. The figures show the percent changes in index of refraction for Sn—Mg-Oxide and Sn—Al-Oxide systems as a function of weight percent of magnesium and aluminum, respectively. The changes in index of refraction for Sn—Mg—O and Al—Sn—O are measured after a heat treatment process of 650 C for 8 minutes, using an ellipsometer with different wavelengths of 400 nm and 550 nm. As shown, tin oxide films exhibit between 2% and 6% changes in index of refraction for these wavelengths (see the graphs at zero weight percent of magnesium and aluminum). With increased doping of magnesium or aluminum, the changes are reduced, and at about 15% and more dopant concentration, the changes are minimized to about 1%.

These data, together with observed structural data, show that Sn—Mg-Oxide and Sn—Al-Oxide compositions with 15% or more by weight of magnesium or aluminum, respectively, exhibit minimal changes in visual appearance and properties after a prolonged high temperature heat treatment process. The present compositions of doped tin oxide with 15% or more magnesium or aluminum are thus suitable for use as dielectric coatings in high transmission, low emissive transparent panels that are needed to be similar in appearance and properties with or without a heat treatment process.

In addition, data show significant improvement for a smaller addition of dopants, such as at 2.5% by weight or more of aluminum for Sn—Al-Oxide system. For example, FIG. 3B shows that the high temperature change in index of refraction at 400 nm wavelength improves by a factor of 2 (e.g., dropping from 5.2% to 2.6%). Thus data indicate that some thermal stability improvements can be accomplished with doping of 2.5% or greater, for example, between 2.5% and 5% by weight aluminum or magnesium in Sn—Al-Oxide or Sn—Mg-Oxide system.

In some embodiments, the present invention discloses a high transmittance, low emissivity coated article, e.g., a panel, including a transparent substrate (such as a glass or plastic substrate) having a transparent dielectric coating of Sn—Mg-Oxide or Sn—Al-Oxide, preferably having at least 15% by weight of magnesium or aluminum. In some embodiments, the concentration of magnesium or aluminum in Sn—Mg-Oxide or Sn—Al-Oxide system is 2.5% or greater, or preferably between 2.5% and 5% by weight (including 5%). The magnesium or aluminum composition is further preferably less than 70% by weight, and more preferably less than 35% by weight. This layer can be used for blocking some infrared (IR) radiation while allowing a high percentage of visible light transmission. In some embodiments, the layer of Sn—Mg-Oxide or Sn—Al-Oxide can be used as a dielectric layer in a low emissivity coating, which can improve the thermal characteristics of such a low emissive coating, for example, providing minimal structural or color changes upon high temperature processing. For example, color or optical property of the present Sn—Mg-Oxide or Sn—Al-Oxide dielectric films can exhibit smaller changes after a high temperature process as compared to those of tin oxide. In some embodiments, a dielectric interlayer comprising doped tin oxide with magnesium or aluminum can be provided together with an (IR) reflecting layer and other coating layers such as antireflective layer and protective layer.

The coated panels according to some embodiments of the invention can be heat treated (e.g., thermally tempered, heat bent and/or heat strengthened), and still retain similar structure, optical and visual appearance as the non heat treated panels. For example, the structure of the present Sn—Mg-Oxide or Sn—Al-Oxide dielectric films is amorphous after deposition, and remains amorphous after a high temperature processing. The high temperature process, e.g., a heat treatment, can comprise a high temperature anneal at 500 C or higher.

In some embodiments, the present invention discloses an improved coated transparent panel, such as a coated glass, that has acceptable visible light transmission and IR reflection, along with thermally stable characteristics after high temperature processing. The present invention also discloses methods of producing the improved, coated, transparent panels, which comprise specific layers in a coating stack. One layer comprises tin oxide having a dopant such as magnesium or aluminum for reflecting thermal energy, such as midrange infrared light. In some embodiments, the coated transparent panels have a low haze value, before and after heat treatments. Haze can be due to the scattering of incident light, caused by surface roughness, for example, large crystalline size, different crystalline sizes or imbedded particles. By controlling the morphological structure, the present magnesium or aluminum doped tin oxide layer can have reduced haze values.

In some embodiments, multiple layer stacks and/or multiple low emissivity layers can be utilized. In addition, the present invention controls the thermal properties of the layer stack so that the optical and structural properties of the heat treated and non heat treated panels are similar. In some embodiments, other coatings are selected to have a high level of visible light transmittance, before and after a heat treatment. In some embodiments, the other layers can be any of the layers well known in the art.

FIGS. 4A-4C illustrate exemplary coating layers on transparent panels according to some embodiments of the present invention. FIG. 4A shows a simple coating stack for a surface coating of transparent substrate 21, such as a glass panel, comprising at least a doped tin oxide composite layer 20 having a dopant of magnesium or aluminum. Relative to the total amount, this dopant of magnesium or aluminum contains equal or greater than 2.5% (such as between 2.5% and 5%), and preferably equal or greater than 15% by weight of the metal content. The layer stack has an IR reflective layer, such as a silver layer 22, and the doped tin oxide composite layer 20 can be used as an upper antireflection layer, a lower antireflection layer, a diffusion barrier layer, or an upper or lower cover layer. The doped tin oxide composite layers can be used with a metallic reflective layer, for example, as a bonding or antireflection layer, with the metallic reflective layer deposited on top, or as a blocker layer below the metallic reflective layers.

The present doped tin oxide layer can improve significantly the thermal stability and haze characteristics, together with possessing excellent structural and optical properties for high transmittal, low emissive panels, at least as compared to comparable tin oxide layers without magnesium or aluminum dopants.

The layers of the invention may be used as a thin layer for antireflection, optical filler, or protective purposes, for example in a thickness range of about 2 to 8 nm. Alternatively, the thickness may be greater, such as between 8 and 80 nm. In some embodiments, the present invention discloses a transparent dielectric layer serving as a thickness optical filler, allowing the film stack to reach a desired thickness. To improve the transmittance, the thicknesses of the coated layers are normally preferred to be as thin as possible. However, in certain cases, a fixed thickness is desirable, for example, to achieve destructive interferences in the beams reflected from the interfaces, and constructive interference in the corresponding transmitted beams. Since the present transparent dielectric layer possesses improved color and optical properties with respect to high temperature process, it can serve as a thickness optical filler for coated articles, preserving its properties after the high temperature process.

In some embodiments, the present invention discloses a high transmittance, low emissivity coated article comprising a transparent substrate, a metallic reflective film comprises one of silver, gold, or copper; and a single transparent dielectric film of tin oxide alloys overlying the substrate, the transparent dielectric film comprising tin oxide doped with aluminum or magnesium, and serving as a thickness optical filler for the metallic reflective film. The transparent dielectric film further exhibits smaller changes with regard to color or optical properties after a high temperature process as compared to those of tin oxide.

In some embodiments, the present invention discloses a high transmittance and low emissive layer stack in which a metallic IR reflective layer such as a thin silver, gold or copper layer, is embedded between two dielectric antireflection layers, at least one of which is an oxidation product of tin and a dopant comprising one of magnesium or aluminum. In some embodiments, the overall optical and structural properties of the doped tin oxide layer are stable after including about 15% by weight dopant. In some embodiments, certain optical or structural properties of the doped tin oxide layer are improved after including about 2.5% by weight dopant, and thus smaller dopant percentages of 2.5% or greater can be used, depending on the specific requirements of the layer stack. The thermal properties can include stable color and structure characteristics, such as minimum color and structure change upon high temperature processing. For example, the morphological structure of the present magnesium or aluminum doped tin oxide is amorphous, which is stable upon high temperature processing, as compared to tin oxide with a polycrystalline structure, which exhibits grain growth upon high temperature annealing.

While the inventive features of the present invention can be achieved with two layers, multilayer embodiments are within the scope and content of the invention. The multilayers can comprise additional high transmittance, low emissivity layers or other functional or decorative layers.

FIG. 4B illustrates an exemplary thin film stack according to some embodiments of the present invention. The thin film stack, disposed on a transparent substrate 51, comprises a metallic IR reflective layer 52 sandwiched between two layers 50 and 53, wherein at least one of these two layers 50 and 53 comprises a dielectric compound layer of magnesium or aluminum doped tin oxide with at least 2.5%, preferably with at least 15%, by weight dopant. In some embodiments, the dielectric compound layer is a high transmission layer with minimal visible light reflection, comprising an alloy of tin and one of magnesium or aluminum that has haze reducing characteristics. The other layer can be a functional layer for low emissivity, such as an antireflective layer, a support layer, such as a top protective layer or a seed layer for the IR reflective layer, or any other stack of layers having a thermal, optical, electrical function.

FIG. 4C illustrates a basic layer sequence incorporating the present doped tin oxide compound layer according to some embodiments of the present invention. A layer stack is disposed on a transparent substrate 51, such as a glass substrate, which can be clear or tinted, monolithic or laminated. The thickness of the glass substrate depends on the applications, and typically is between 1 and 20 mm. The transparent substrate can also be a polymer or plastic substrate.

A coating stack is provided on the substrate 51, either directly or indirectly, comprising multiple layers, some of which can be optional. The coating stack can comprise one or more antireflective films, a metallic IR reflective film comprising silver, gold or copper, and a top protective film for protecting the coating stack.

In some embodiments, the coating stack can comprise a first dielectric, antireflective film stack on the substrate, including a single layer or multiple layers for different functional purposes. For example, the first antireflective film stack can comprise a bottom dielectric layer 54 for protecting the substrate, an antireflective layer 50, and a contact or seed layer 55 to facilitate the IR reflective layer 52.

The bottom dielectric layer 54 can comprise silicon nitride, silicon oxynitride, or other nitride material such as SiZrN, for example, to protect the glass substrate or to improve the haze reduction properties. The antireflective layer 50 serves to reduce the reflection of visible light, selected based on transmittance, index of refraction, adherence, chemical durability, and thermal stability. In some embodiments, the antireflective layer 50 comprises magnesium or aluminum doped tin oxide, offering highly thermal stability properties, allowing the film stack to possess similar visual and functional properties before and after a heat treatment process. The antireflective layer 50 can comprise titanium dioxide, silicon nitride, silicon dioxide, silicon oxynitride, niobium oxide, SiZrN, tin oxide, zinc oxide, or any other suitable dielectric material, for example, in some applications that do not require a high level of thermal stability.

The contact layer 55 can be used to provide a seed layer for the IR reflective film, for example, a zinc oxide layer deposited before the deposition of a silver reflective layer can provide a silver layer with lower resistivity, which can improve its reflective characteristics. The contact layer can comprise nickel oxide, nickel chrome oxide, nickel alloy oxides, chrome oxides, or chrome alloy oxides.

On the first antireflective film stack is an IR reflective layer 52. The IR reflective layer can be a metallic, reflective film, such as gold, copper, or silver. In general, the IR reflective film comprises a good electrical conductor, blocking the passage of thermal energy.

On the IR reflective layer 52 is a second antireflective film stack, including a single layer or multiple layers for different functional purposes. For example, the second antireflective film stack can comprise a top contact layer 56, a top antireflective layer 57, and top protective layer 58 for protecting the total film stack. The top contact layer 56 can be used to protect the IR reflective layer, such as a primer film or an oxygen gettering film. The top contact layer can comprise titanium, nickel or a combination of nickel and titanium. The protective layer 58 can be an exterior protective layer, such as silicon nitride, silicon oxynitride, titanium oxide, tin oxide, zinc oxide, niobium oxide, or SiZrN.

In some embodiments, the coating can comprise a double or triple layer stack, having multiple IR reflective layers.

In some embodiments, the present invention is also directed to a method for producing heat treated and non-heat treated coated transparent panels wherein there are minimal changes in structure or color appearance between two types of panels after being heat treated for less than 10-20 minutes at temperatures greater than 500 C.

Figure 5A:
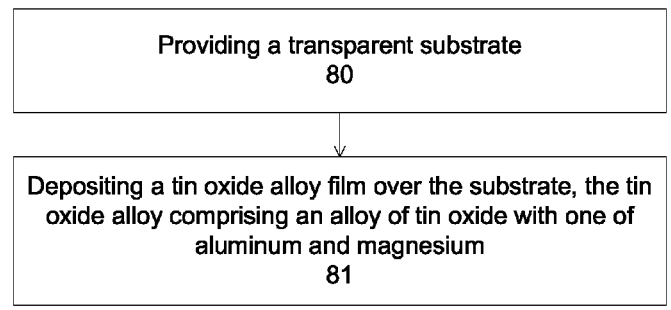
FIGS. 5A-5B illustrate exemplary processes for provide thermal stable coatings.
Figure 5B:
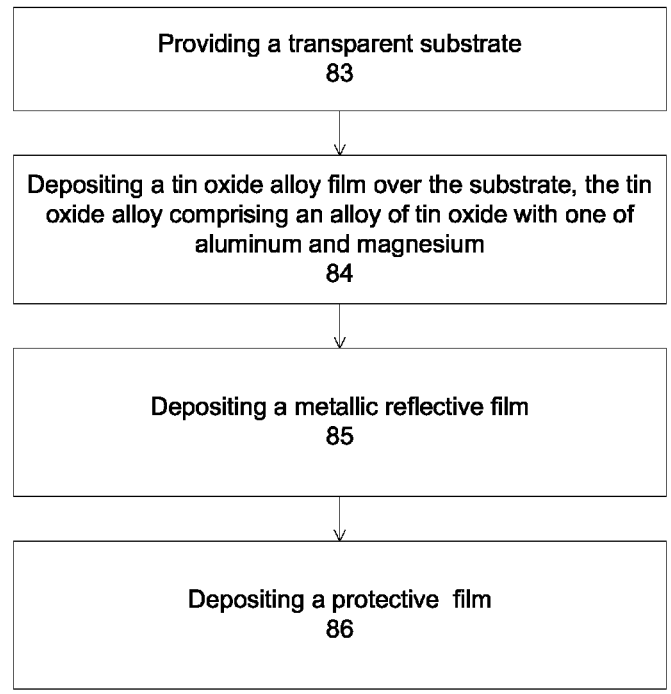

FIGS. 5A-5B illustrate exemplary processes for provide thermally stable coatings according to some embodiments of the present invention. In FIG. 5A, a film stack comprising a tin oxide film alloyed with either magnesium or aluminum is used for a low emissive coating with high thermal stability. Operation 80 provides a transparent substrate, such as a glass substrate or a plastic substrate. Operation 81 deposits a transparent dielectric film comprising tin oxide alloy over the substrate, wherein the tin oxide alloy comprises an alloy of tin oxide with one of aluminum or magnesium, and wherein the amount of magnesium or aluminum is at least 2.5%, preferably with at least 15%, by weight. The tin oxide alloy can be a high thermally stable film, allowing the coated substrate to be similar in functions and appearance for as-coated and heat treated products. For example, color or optical property of the present Sn—Mg-Oxide or Sn—Al-Oxide dielectric films can exhibit smaller changes after a high temperature process as compared to those of tin oxide.

In FIG. 5B, another film stack comprising the present doped tin oxide film is used for a low emissive coating with high thermal stability, together with a metallic IR reflective layer and an optional protective layer. Other layers can be incorporated in the film stack such as an antireflective film. Operation 83 provides a transparent substrate. Operation 84 deposits a tin oxide alloy film over the substrate, wherein the tin oxide alloy comprises an alloy of tin oxide with one of aluminum or magnesium, and wherein the amount of magnesium or aluminum is at least 2.5%, preferably with at least 15%, by weight. The tin oxide alloy film can be used as an antireflective film for the film stack. Additional optional antireflective films can also be deposited. Operation 85 deposits a metallic reflective film. Operation 86 deposits a top film. The order of the film depositions can be different, depending on a particular film stack. In some embodiments, multiple film stacks can be used.

The coated film stack can be heat treated, for example, annealing at a temperature higher than 500 C and less than 1000 C, for less than 10 minutes. After the heat treatment, the coated film stack maintains similar appearance and properties as the unheated coated film stack. In some embodiments, the coated film stack has improved appearance and properties as compared to the unheated coated film stack, for example, as compared to prior art tin oxide antireflection coating.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A film stack comprising:
   a first dielectric layer, wherein the first dielectric layer consists of tin, oxygen, and one of aluminum or magnesium, wherein the aluminum or magnesium comprises more than 15% by weight of the total metal content of the composition of the first dielectric layer;
   a first reflective layer disposed above the first dielectric layer, wherein the first reflective layer comprises silver; and
   a first barrier layer disposed above the first reflective layer, wherein the first barrier layer comprises nickel, niobium, and titanium.

2. A film stack as in claim 1, wherein the aluminum or magnesium comprises less than 70% by weight of the total metal content of the composition of the first dielectric layer.

3. A film stack as in claim 1, wherein a structure of the first dielectric layer is amorphous.

4. A film stack as in claim 1, further comprising a second dielectric layer disposed above the first reflective layer, wherein the second dielectric layer consists of tin, oxygen, and one of aluminum or magnesium.

5. A film stack as in claim 1, wherein the film stack is a transparent dielectric film stack, and wherein the film has an appearance that remains the same, by visual inspection, after a heat treatment.

6. A film stack as in claim 5, wherein the first dielectric layer consists of tin oxide doped with one of aluminum or magnesium.

7. A film stack comprising;
   a dielectric layer, wherein the dielectric layer consists of tin, oxygen, and one of aluminum or magnesium, wherein the aluminum or magnesium comprises more than 15% by weight of the total metal content of the composition of the first dielectric layer;
   a seed layer, disposed above the dielectric layer, wherein the seed layer comprises zinc oxide;
   a reflective layer disposed above the seed layer, wherein the reflective layer comprises silver;
   a barrier layer disposed above the reflective layer, wherein the barrier layer comprises nickel, niobium, and titanium; and
   an overcoat layer disposed above the barrier layer, wherein the overcoat layer consists of tin, oxygen, and one of aluminum or magnesium.

8. A film stack as in claim 7, wherein the film stack is a transparent dielectric film stack, and wherein the film has an appearance that remains the same, by visual inspection, after a heat treatment.

9. A film stack as in claim 8, wherein the dielectric layer consists of tin oxide doped with one of aluminum or magnesium.

10. A film stack as in claim 7, wherein the dielectric layer consists of tin oxide doped with aluminum.

11. A film stack as in claim 7, wherein the aluminum or magnesium comprises less than 70% by weight of the total metal content of the composition of the dielectric layer.

12. A film stack as in claim 7, wherein the dielectric layer consists of tin oxide doped with magnesium.

13. A film stack comprising:
   a first dielectric layer, wherein the first dielectric layer consists of tin, oxygen, and one of aluminum or magnesium, wherein the aluminum or magnesium comprises more than 15% by weight of the total metal content of the composition of the first dielectric layer;
   a first seed layer, disposed above the first dielectric layer, wherein the seed layer comprises zinc oxide;
   a first reflective layer disposed above the first seed layer, wherein the first reflective layer comprises silver;
   a first barrier layer disposed above the first reflective layer, wherein the first barrier layer comprises nickel, niobium, and titanium;
   a second dielectric layer disposed above the first barrier layer, wherein the second dielectric layer consists of tin, oxygen, and one of aluminum or magnesium;
   a second seed layer, disposed above the second dielectric layer, wherein the seed layer comprises zinc oxide;
   a second reflective layer disposed above the second seed layer, wherein the second reflective layer comprises silver;
   a second barrier layer disposed above the second reflective layer, wherein the second barrier layer comprises nickel, niobium, and titanium; and
   a first overcoat layer disposed above the first barrier layer, wherein the first overcoat layer consists of tin, oxygen, and one of aluminum or magnesium.

14. A film stack as in claim 13, wherein the film stack is a transparent dielectric film stack, and wherein the film has an appearance that remains the same, by visual inspection, after a heat treatment.

15. A film stack as in claim 14, wherein the aluminum or magnesium comprises less than 70% by weight of the total metal content of the composition of the second dielectric layer.

16. A film stack as in claim 13, wherein the second dielectric layer consists of tin oxide doped with aluminum.

17. A film stack as in claim 13, wherein the second dielectric layer consists of tin oxide doped with magnesium.

* * * * *